US009990873B2

(12) United States Patent
Jang et al.

(10) Patent No.: US 9,990,873 B2
(45) Date of Patent: Jun. 5, 2018

(54) DISPLAY APPARATUS AND METHOD OF TESTING THE SAME

(71) Applicant: SAMSUNG DISPLAY CO., LTD., Yongin, Gyeonggi-Do (KR)

(72) Inventors: Hwan-Soo Jang, Yongin (KR); Won-Kyu Kwak, Yongin (KR); Jin-Tae Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 14/621,283

(22) Filed: Feb. 12, 2015

(65) Prior Publication Data

US 2015/0241501 A1    Aug. 27, 2015

(30) Foreign Application Priority Data

Feb. 25, 2014    (KR) .................. 10-2014-0022184

(51) Int. Cl.
*G01R 31/02* (2006.01)
*G01R 27/16* (2006.01)
*G09G 3/00* (2006.01)
*G09G 3/3225* (2016.01)
*G01R 31/28* (2006.01)

(52) U.S. Cl.
CPC ........... *G09G 3/006* (2013.01); *G09G 3/3225* (2013.01); *G01R 31/2812* (2013.01)

(58) Field of Classification Search
CPC .............................. G01R 31/026; G01R 27/16
USPC ........................................................ 324/527
See application file for complete search history.

(56) References Cited

U.S. PATENT DOCUMENTS

| 9,741,962 | B2* | 8/2017 | Lee | ............ H01L 51/5246 |
| 2006/0001622 | A1* | 1/2006 | Kim | ............ G09G 3/3266 345/76 |
| 2009/0262048 | A1 | 10/2009 | Park et al. | |
| 2010/0225770 | A1* | 9/2010 | Morimoto | ............ G09G 3/006 348/189 |
| 2011/0080173 | A1 | 4/2011 | Kim et al. | |
| 2011/0279746 | A1 | 11/2011 | Kim et al. | |
| 2013/0328852 | A1* | 12/2013 | Jamal | ............ G09G 3/3225 345/212 |
| 2014/0028859 | A1* | 1/2014 | Kim | ............ G09G 3/30 348/189 |
| 2014/0117320 | A1* | 5/2014 | Jung | ............ H01L 27/3276 257/40 |
| 2014/0354286 | A1 | 12/2014 | Kim | |

(Continued)

FOREIGN PATENT DOCUMENTS

| KR | 10-2009-0105027 A | 10/2009 |
| KR | 10-2011-0032328 A | 3/2011 |
| KR | 10-2011-0037638 A | 4/2011 |

(Continued)

*Primary Examiner* — Jermele M Hollington
(74) *Attorney, Agent, or Firm* — Lewis Roca Rothgerber Christie LLP

(57) ABSTRACT

A display apparatus includes: a display unit including a plurality of pixels connected to a plurality of scan lines and a plurality of data lines; an initialization unit for applying an initialization signal to the plurality of data lines; and a wire test unit for applying a wire test signal to the plurality of data lines through a plurality of fan-out lines respectively connected to one end of each of the plurality of data lines.

27 Claims, 13 Drawing Sheets

(56) References Cited

U.S. PATENT DOCUMENTS

2015/0002560 A1* 1/2015 Kwon ................. G09G 3/3266
                                                                            345/691
2015/0008937 A1* 1/2015 Lee ..................... G09G 3/3225
                                                                            324/539

FOREIGN PATENT DOCUMENTS

| KR | 10-2011-0125400 A | 11/2011 |
| KR | 10-2014-0141375 A | 12/2014 |

* cited by examiner

DISPLAY APPARATUS AND METHOD OF TESTING THE SAME

CROSS-REFERENCE TO RELATED APPLICATION

This application claims priority to and the benefit of Korean Patent Application No. 10-2014-0022184, filed on Feb. 25, 2014, in the Korean Intellectual Property Office, the disclosure of which is incorporated herein in its entirety by reference.

BACKGROUND

1. Field

One or more embodiments of the present invention relate to a display apparatus and a method of testing the same.

2. Description of the Related Art

A panel undergoes various tests during a general process for manufacturing a display apparatus. One of these tests is an open detection test for detecting an open data line or fan-out line by using a screen displayed by applying a signal to data lines.

However, a resistance defect of the data line or fan-out line may not be detected via such an open detection test.

SUMMARY

One or more embodiments of the present invention include a display apparatus and a method of testing the same so that an open circuit and a resistance defect of a wire may be concurrently (e.g., simultaneously) detected before a module process is performed.

Additional aspects will be set forth in part in the description which follows and, in part, will be apparent from the description, or may be learned by practice of the presented embodiments.

According to one or more embodiments of the present invention, a display apparatus includes a display unit including a plurality of pixels connected to a plurality of scan lines and a plurality of data lines; an initialization unit configured to apply an initialization signal to the plurality of data lines; and a wire test unit configured to apply a wire test signal to the plurality of data lines through a plurality of fan-out lines respectively connected at a first end of each of the plurality of data lines.

The initialization signal may be configured to be applied before the wire test signal.

The initialization unit may include a plurality of first switches respectively located between initialization signal lines and a second end of each of the plurality of data lines.

The plurality of first switches may include: a first initialization switch between a first initialization signal line of the initialization signal lines and a data line corresponding to a column of first pixels; a second initialization switch between a second initialization signal line of the initialization signal lines and a data line corresponding to a column of second pixels; and a third initialization switch between a third initialization signal line of the initialization signal lines and a data line corresponding to a column of third pixels.

The first pixels and the second pixels may be alternately arranged in a same column, the first initialization switch may be between the first initialization signal line and the data line of the column of the first pixels and the second pixels, and the second initialization switch may be between the second initialization signal line and the data line of the column of the first pixels and the second pixels.

The initialization unit may be configured to apply a lighting test signal supplied from the initialization signal lines to the plurality of data lines through the plurality of first switches at a time different from a time when the initialization signal is applied.

The wire test unit may include a plurality of second switches respectively located between each of the plurality of fan-out lines and a test signal line, wherein the test signal line is configured to provide the wire test signal.

The plurality of second switches may include: a first test switch between a first test signal line and a first fan-out line of the plurality of fan-out lines connected to a data line corresponding to a column of first pixels; a second test switch between a second test signal line and a second fan-out line of the plurality of fan-out lines connected to a data line corresponding to a column of second pixels; and a third test switch between a third test signal line and a third fan-out line of the plurality of fan-out lines connected to a data line corresponding to a column of third pixels.

The apparatus may further include a plurality of data pads connected to the plurality of fan-out lines, wherein the plurality of second switches are respectively located between the plurality of data pads and the test signal line.

The plurality of second switches may include: a first test switch between a first test signal line and a data pad connected to a first fan-out line of the plurality of fan-out lines, wherein the first fan-out line is connected to a data line corresponding to a column of first pixels; a second test switch between a second test signal line and a data pad connected to a second fan-out line of the plurality of fan-out lines, wherein the second fan-out line is connected to a data line corresponding to a column of second pixels; and a third test switch between a third test signal line and a data pad connected to a third fan-out line of the plurality of fan-out lines, wherein the third fan-out line is connected to a data line corresponding to a column of third pixels.

The wire test unit may be configured to apply a lighting test signal supplied from the test signal line to the plurality of data lines through the plurality of second switches at a time different from a time the wire test signal is applied.

According to one or more embodiments of the present invention, a display apparatus may include: a display unit including a plurality of pixels connected to a plurality of scan lines and a plurality of data lines; an initialization unit including a plurality of first switches between a first signal line and a first end of each of the plurality of data lines, the plurality of first switches being configured to apply an initialization signal supplied by the first signal line to the first end of each of the plurality of data lines through the plurality of first switches; and a wire test unit including a plurality of second switches between a second signal line and a plurality of fan-out lines, the plurality of fan-out lines being connected to a second end of each of the plurality of data lines, the plurality of second switches being configured to apply a wire test signal supplied by the second signal line to the second end of each of the plurality of data lines via the plurality of fan-out lines through the plurality of second switches.

The initialization signal may be configured to be applied before the wire test signal.

Each of the plurality of first switches may include: a gate connected to a control line; a first terminal connected to the first signal line; and a second terminal connected to the first end of one of the plurality of data lines.

The initialization unit may include a plurality of first signal lines, and each of the plurality of first switches may include a gate connected to a control line, a first terminal connected to one of the plurality of first signal lines, and a second terminal connected to the first end of one of the plurality of data lines.

The initialization unit may include a plurality of first signal lines, and each of the plurality of first switches includes a gate connected to one of a plurality of control lines, a first terminal connected to one of the plurality of first signal lines, and a second terminal connected to the first end of one of the plurality of data lines.

The plurality of first switches may be configured to apply a lighting test signal to the first end of each of the plurality of data lines at a time different from a time when the initialization signal is applied.

Each of the plurality of second switches may include a gate connected to a control line, a first terminal connected to the second signal line, and a second terminal connected to one of the plurality of fan-out lines.

The initialization unit may include a plurality of second signal lines, and each of the plurality of first switches includes a gate connected to a control line, a first terminal connected to one of the plurality of second signal lines, and a second terminal connected to one of the plurality of fan-out lines.

The plurality of second switches may be configured to apply a lighting test signal to the second end of each of the plurality of data lines at a time different from a time when the wire test signal is applied.

The display apparatus may further include a plurality of data pads respectively connected to the plurality of fan-out lines, and the plurality of second switches being located between the plurality of data pads and the second signal line.

According to one or more embodiments of the present invention, a method of testing a display apparatus having a display unit including a plurality of pixels connected to a plurality of scan lines and a plurality of data lines and a plurality of fan-out lines respectively connected to a first end of each of the plurality of data lines, is described. The method may include: applying an initialization signal to the first end or a second end of each of the plurality of data lines; and applying a wire test signal to the second end of each of the plurality of data lines via the plurality of fan-out lines.

The wire test signal may be applied after the initialization signal is applied to the plurality of data lines.

The applying of the initialization signal may include: electrically connecting, by a plurality of first switches respectively located between the first end or the second end of each of the plurality of data lines and a signal line, the signal line being configured to supply the initialization signal; and applying the initialization signal to the first end or the second end of each of the plurality of data lines through the plurality of first switches.

The applying of the wire test signal may include electrically connecting, by a plurality of second switches respectively located between the plurality of fan-out lines and a test signal line, the test signal line being configured to supply the wire test signal; and applying the wire test signal to the second end of each of the plurality of data lines through the plurality of second switches.

The method may further include detecting a defective fan-out line connected to a data line of the plurality of data lines corresponding to a column of pixels emitting light having a luminance higher than a luminance of adjacent columns from among the plurality of pixels.

The method may further include applying a lighting test signal to the second end of each of the plurality of data lines.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
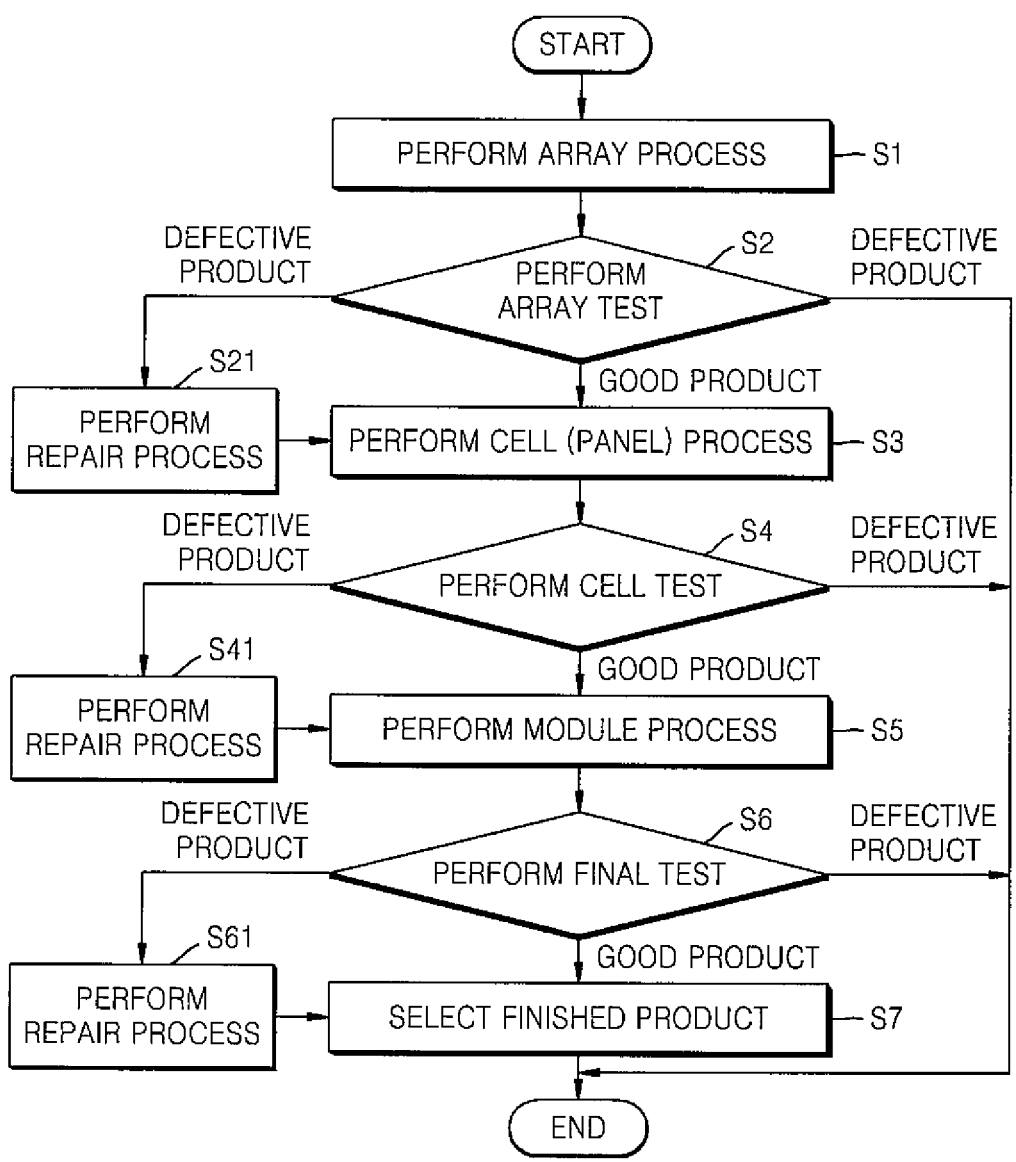
FIG. 1 is a flowchart of a method of manufacturing an organic light-emitting display apparatus, according to an embodiment of the present invention.

Hereinafter, the present invention will be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, like reference numerals denote like elements, and overlapping descriptions are omitted.

In the specification, the terms such as "first", "second", etc., do not have limited meanings and are used only to distinguish one component from another. An expression used in the singular form also encompasses the plural form, unless it has a clearly different meaning in the context.

In the present specification, it is to be understood that the terms such as "including" or "having," etc., are intended to indicate the existence of the features or components, and are not intended to preclude the possibility that one or more other features or components may exist or may be added.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on" etc.).

As used herein, the term "and/or" includes any and all combinations of one or more of the associated listed items.

FIG. 1 is a flowchart of a method of manufacturing an organic light-emitting display apparatus, according to an embodiment of the present invention.

First, an array process for forming a pixel circuit array on a substrate is performed in operation S1. Each pixel circuit may include at least two thin-film transistors (TFTs) and at least one capacitor. Then, an array test for detecting a defect in the pixel circuit array is performed in operation S2. During the operation S2, it is tested whether the TFT normally operates. A repair process may be performed in operation S21 on a pixel circuit that is determined to be defective during the operation S2. If the pixel circuit that is determined to be defective is not repairable, the operation for this defective pixel circuit may be ended.

A cell (panel) process is performed in operation S3 to complete an organic light-emitting device (OLED) by forming an anode, an organic emission layer, and a cathode with respect to a pixel array that is determined to be a good product or is repaired (e.g., previously defective but repaired during operation S21), and then a cell test is performed in operation S4. Examples of the cell test include a lighting test, a wire test (or a line test), a current leakage test, and/or an aging test performed on a panel. A repair process may be performed in operation S41 on a panel that is determined to be defective in the operation S4. If the panel that is determined to be defective is not repairable, the operation for this defective panel may be ended.

A module process is performed in operation S5 on a panel that is determined to be good product or is repaired, a final test is performed in operation S6, and then a finished product is selected in operation S7. A repair process may be performed in operation S61 on a module that is determined to be defective in the operation S6. If the module that is determined to be defective is not repairable, the operation for this defective module may be ended.

Figure 2:
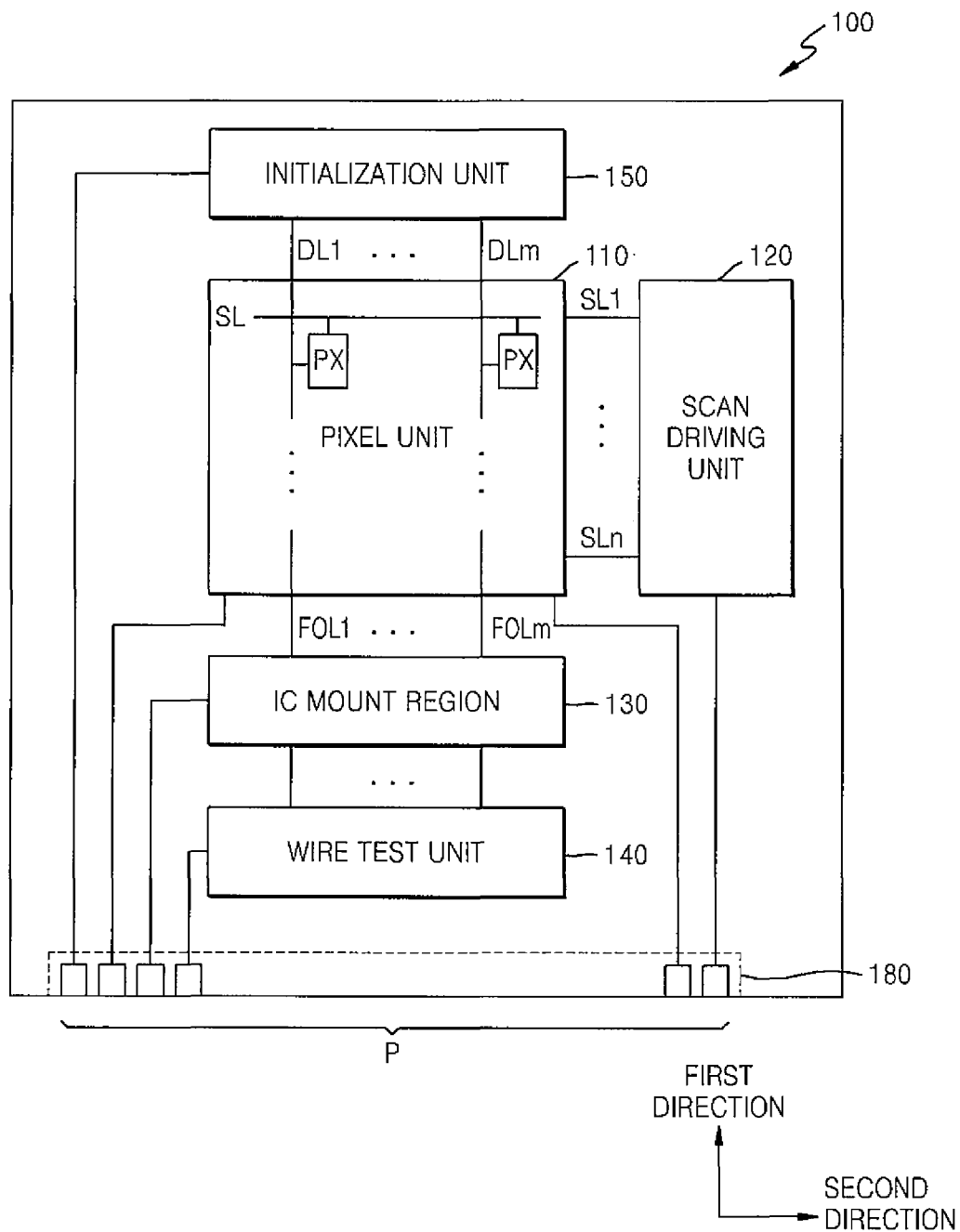
FIG. 2 is a plan view schematically illustrating a display apparatus according to an embodiment of the present invention.

FIG. 2 is a plan view schematically illustrating a display apparatus 100 according to an embodiment of the present invention.

Referring to FIG. 2, the display apparatus 100 includes a display unit (pixel unit) 110, a scan driving unit 120 (or scan driver), an integrated circuit (IC) mount region 130, a wire test unit 140, an initialization unit 150, and a pad unit 180.

Examples of the display apparatus 100 include an organic light-emitting display apparatus, a liquid crystal display apparatus, and a field emission display (FED) apparatus.

The display unit 110 includes a plurality of pixels PX that emit lights of different colors and are respectively at crossing regions of a plurality of data lines DL1 through DLm and a plurality of scan lines SL1 through SLn. The data lines DL1 through DLm are arranged along a first direction, and the scan lines SL1 through SLn are arranged along a second direction. Hereinafter, for convenience of description, reference numerals are indexed from the left.

The scan driving unit 120 generates scan signals, according to scan driving power sources VDD and VSS, and a scan control signal SCS, which are supplied from outside the display apparatus 100, and sequentially supplies the generated scan signals to the scan lines SL1 through SLn.

A plurality of data pads respectively coupled to fan-out lines FOL1 through FOLm extending from the data lines DL1 through DLm of the display unit 110 are in the IC mount region 130. A data driving unit (or data driver) is bonded to the data pads via a chip-on-glass (COG) method and mounted on the IC mount region 130. The data driving unit generates data signals according to display data DATA and a data control signal DCS, and supplies the generated data signals to the data lines DL1 through DLm.

The wire test unit 140 is able to concurrently (e.g., simultaneously) detect a resistance defect and an open circuit of the fan-out lines FOL1 through FOLm, i.e., wires connecting the data lines DL1 through DLm of the display unit 110 and the data pads of the IC mount region 130. For example, a resistance defect is detected by detecting a vertical line defect generated on a screen according to a high resistance caused by a crack of a fan-out line. An open is detected by detecting a disconnect of a data line or fan-out line. The wire test unit 140 receives a test signal and a test control signal, and supplies the test signal to the data lines DL1 through DLm through the fan-out lines FOL1 through FOLm according to the test control signal. The initialization unit 150 is not active when the wire test unit 140 is active.

According to an embodiment, the initialization unit 150 is activated before the wire test unit 140 is activated, and supplies an initialization signal to the data lines DL1 through DLm. The initialization unit 150 supplies the initialization signal directly to the data lines DL1 through DLm, without having to pass through the fan-out lines FOL1 through FOLm. The wire test unit 140 is not active when the initialization unit 150 is active.

The pad unit 180 includes a plurality of pads P for transmitting power and/or signals supplied from the outside to the display apparatus 100. In FIG. 2, locations and a number of lines connecting the pad unit 180 and each feature of the display apparatus 100 are shown for convenience, and thus a plurality of lines may be shown at different locations. For example, there may be five lines for supplying a signal from the pad unit 180 to the scan driving unit 120 so as to receive a scan control signal (SCS) used as a start pulse SP, a scan clock signal CLK, and an output enable signal OE, and the scan driving power sources VDD and VSS.

In FIG. 2, the scan driving unit 120 is shown as being on the right, but the embodiment is not limited thereto, and the scan driving unit 120 may be on the left or on both on the left and right.

Figure 3:
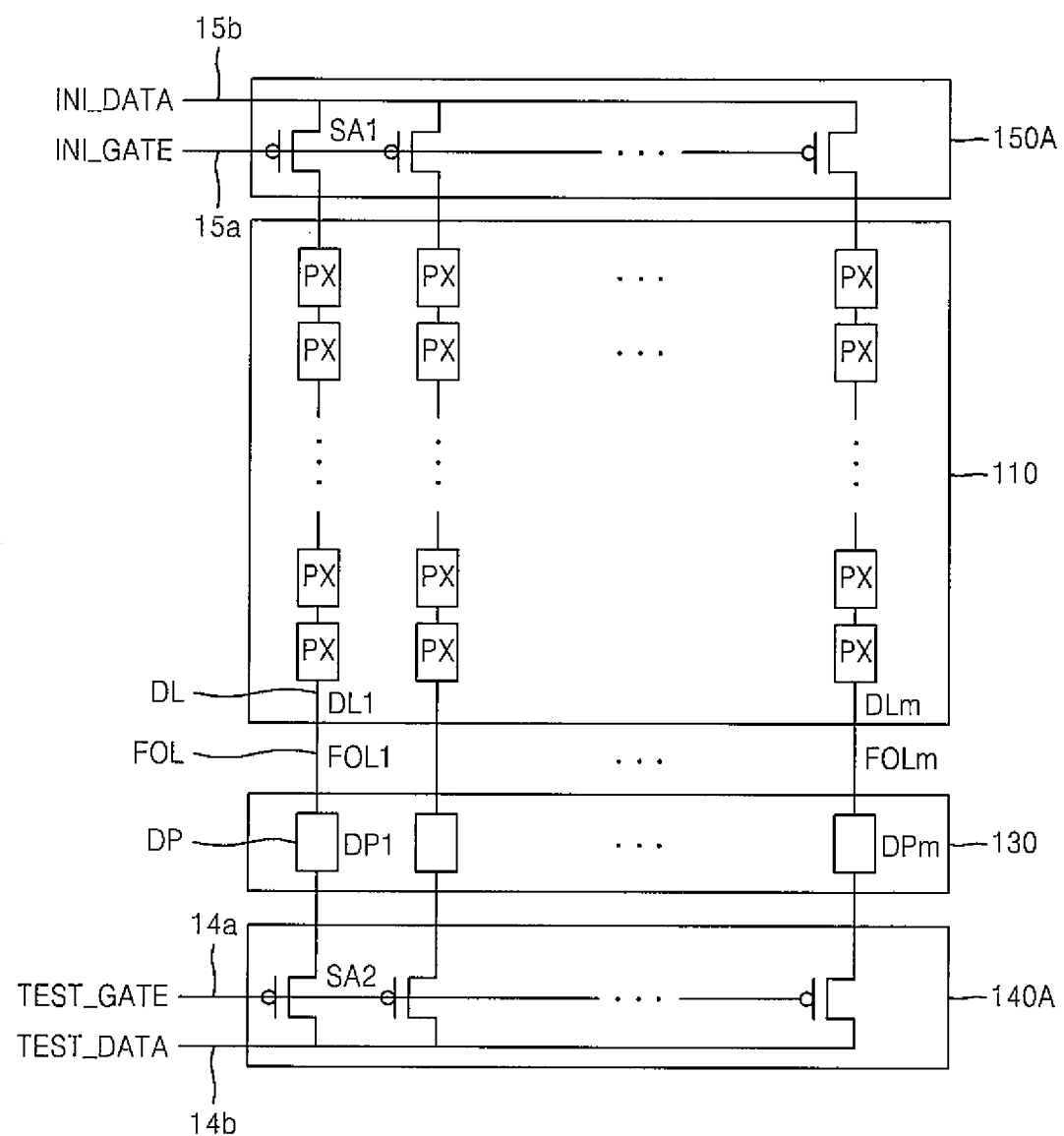
FIG. 3 is a plan view of an example of the display apparatus of FIG. 2.
Figure 4:
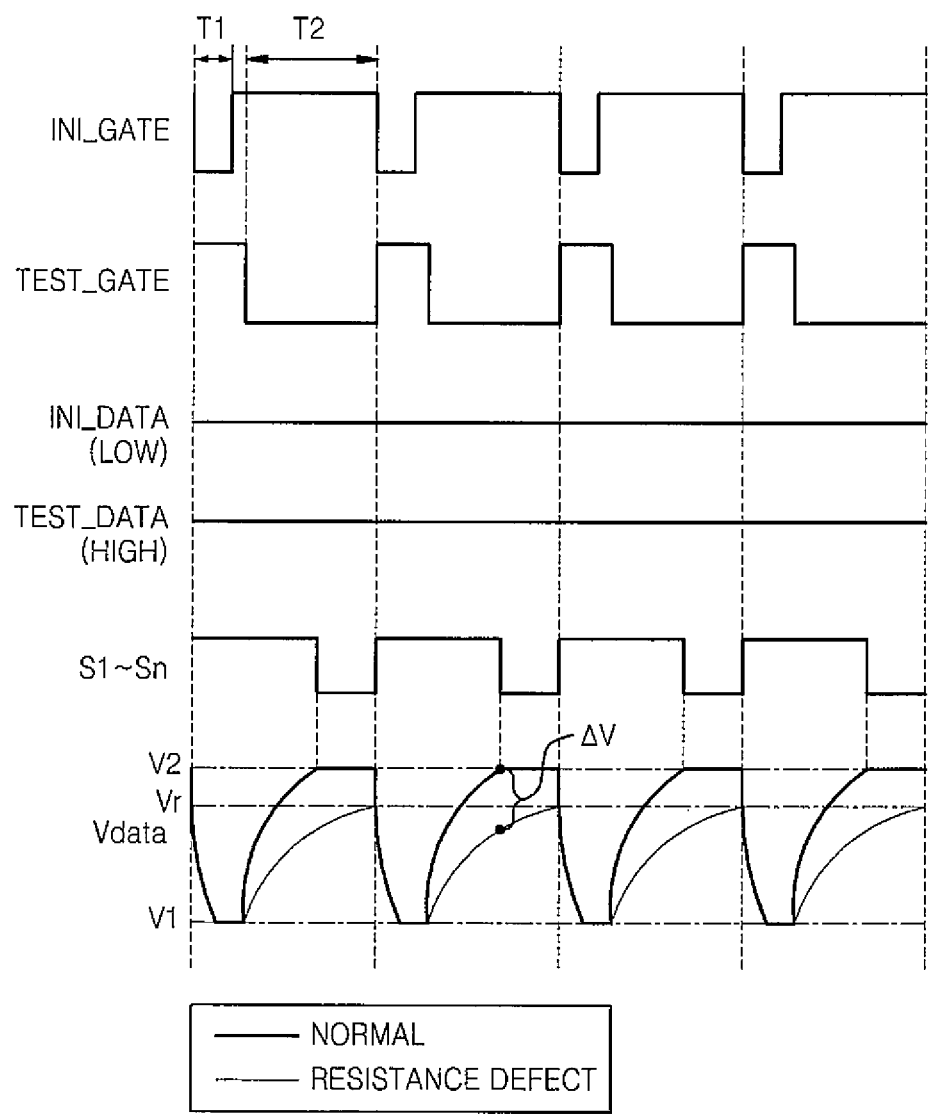
FIG. 4 is a timing diagram for describing a wire test for the display apparatus of FIG. 3.

FIG. 3 is a plan view of an example of the display apparatus 100 of FIG. 2. FIG. 4 is a timing diagram for illustrating a wire test for the display apparatus 100 of FIG. 3.

Referring to FIG. 3, the plurality of pixels PX may be arranged in column and row directions in the display unit 110. The pixels PX may include, for example, first pixels, second pixels, and third pixels, which emit lights in different colors. The first pixel may be a red pixel for emitting a red light, the second pixel may be a blue pixel for emitting a blue light, and the third pixel may be a green pixel for emitting a green light. For convenience of description, the scan lines SL1 through SLn are not shown in FIG. 3.

According to an embodiment, data pads DP1 through DPm coupled to the fan-out lines FOL1 through FOLm extending respectively from ends of the data lines DL1 through DLm may be in the IC mount region 130.

An initialization unit 150A includes a plurality of first switches SA1 respectively coupled to other ends of the data lines DL1 through DLm. A gate of the first switch SA1 is coupled to a control line 15a for supplying an initialization control signal INI_GATE. A first terminal of the first switch SA1 is coupled to an initialization signal line 15b for supplying an initialization signal INI_DATA, and a second terminal of the first switch SA1 is coupled to one of the data lines DL1 through DLm.

A test unit 140A may include second switches SA2 between the data pads DP1 through DPm and a test signal line 14b. A gate of the second switch SA2 is coupled to a control line 14a for supplying a test control signal TEST_GATE. A first terminal of the second switch SA2 is coupled to the test signal line 14b for supplying a test signal TEST_DATA, and a second terminal of the second switch SA2 is coupled to one of the data pads DP1 through DPm.

Referring to FIG. 4, a wire test may be performed during a first period T1, which is an initialization section and a second period T2, which is a test section.

The first switches SA1 receive the initialization control signal INI_GATE for maintaining an on-state during the first period T1. Accordingly, the first switches SA1 maintain the on-state while supplying the initialization signal INI_DATA of a first voltage V1 at a low level from the initialization signal line 15b to the data lines DL1 through DLm. The second switches SA2 receive the test control signal TEST_GATE for maintaining an off-state during the first period T1, and maintain the off-state.

The first switches SA1 receive the initialization control signal INI_GATE for maintaining an off-state during the second period T2, and maintain the off-state. Scan signals S1 through Sn are sequentially supplied from scan lines to the pixels P during the second period T2, and the second switches SA2 receive the test control signal TEST_GATE for maintaining an on-state. Accordingly, the second switches SA2 maintain the on-state while supplying the test signal TEST_DATA of a second voltage V2 in a high level from the test signal line 14b to the data lines DL1 through DLm.

A voltage Vr lower than the second voltage V2 is supplied to a data line supplied through a fan-out line that is resistance defective (e.g., having a defective resistance) from among the fan-out lines FOL1 through FOLm. Accordingly, pixels in a column including a data line coupled to a fan-out line having a resistance defect have a vertical line defect and a luminance difference corresponding to a voltage difference ($\Delta V = V2 - Vr$) compared to pixels in adjacent columns.

In other words, a fan-out line coupled to a data line of a column emitting a light having higher or a lower luminance than that of adjacent columns may be detected to have a resistance defect or a short defect (e.g., defect having a short circuit). The short defect and resistance defect may be differentiated from each other based on a degree of a luminance difference with respect to adjacent columns.

Figure 5:
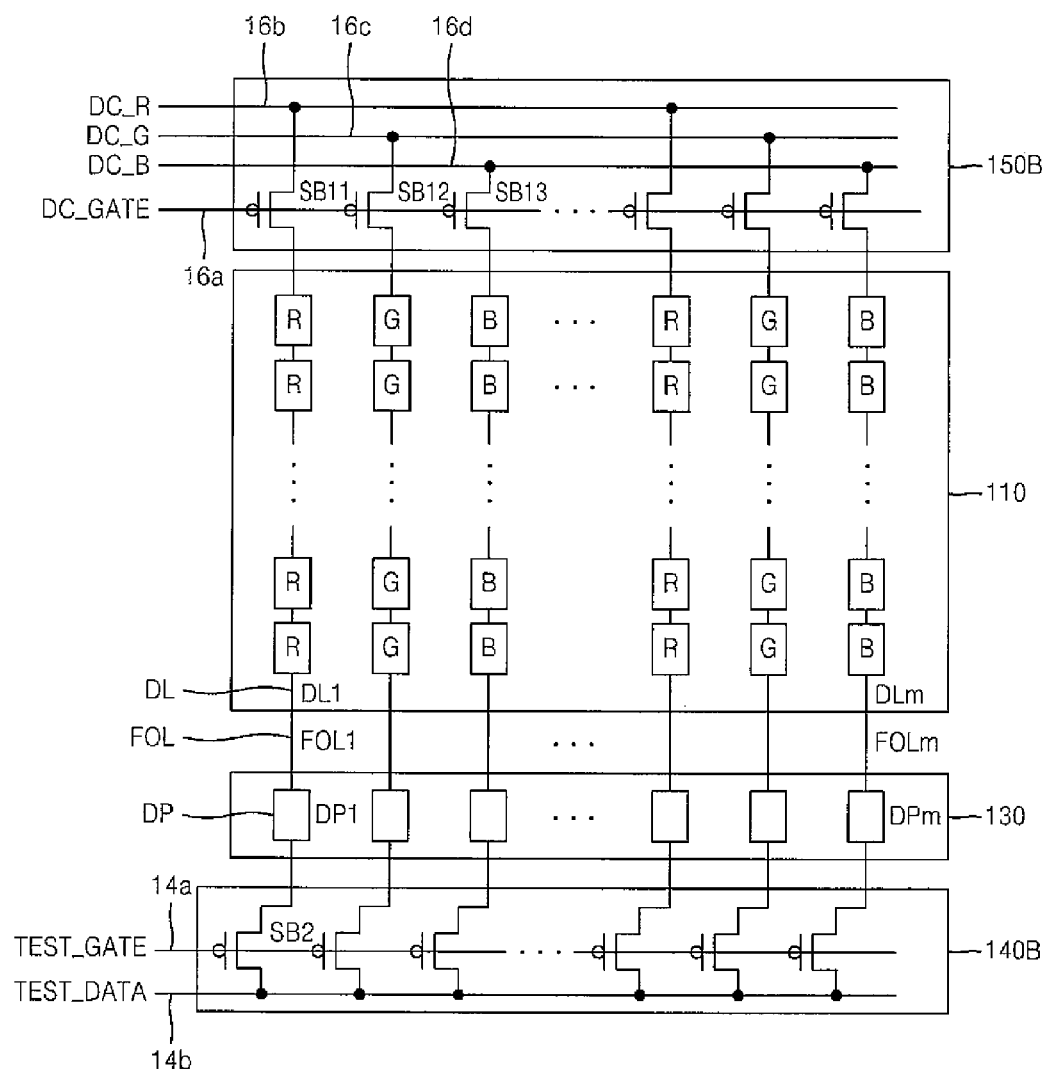
FIG. 5 is a diagram of a display apparatus according to another embodiment of the present invention.
Figure 6:
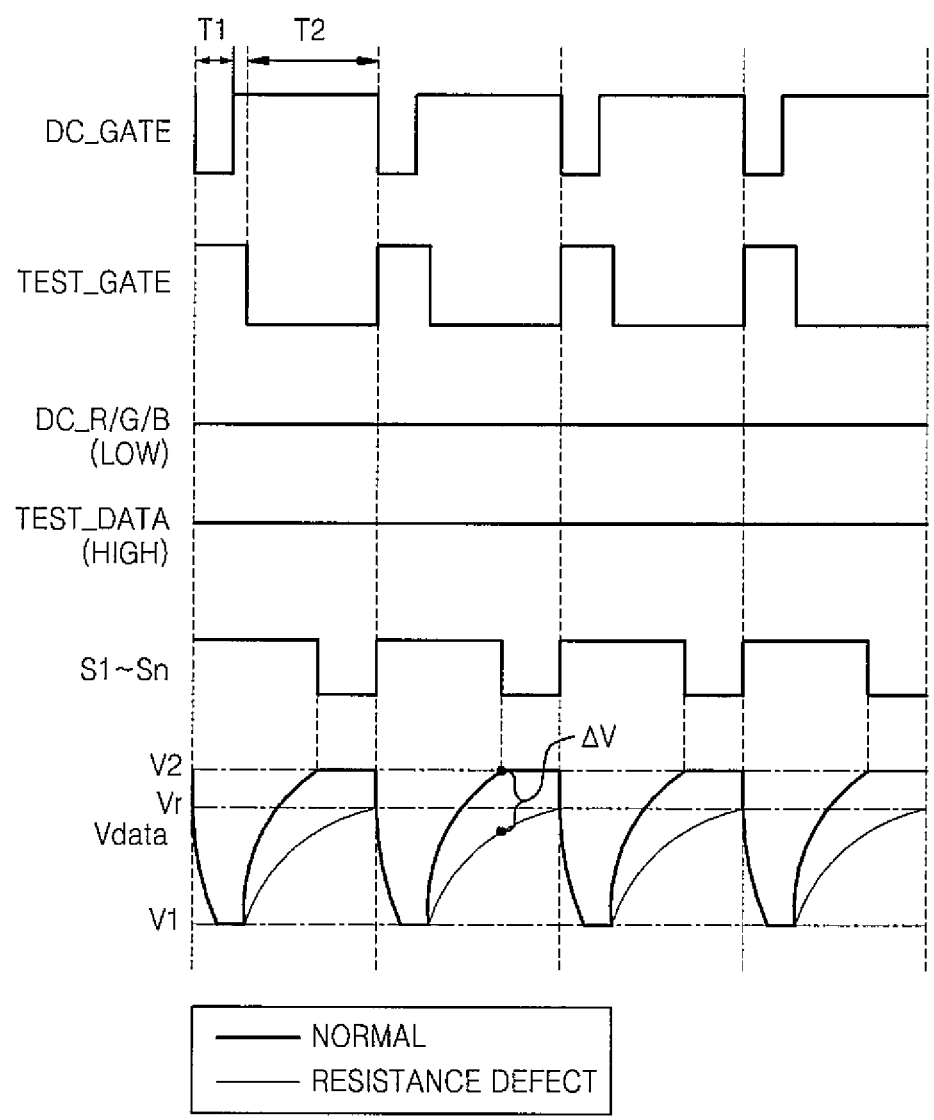
FIG. 6 is a timing diagram for describing a wire test for the display apparatus of FIG. 5.
Figure 7:
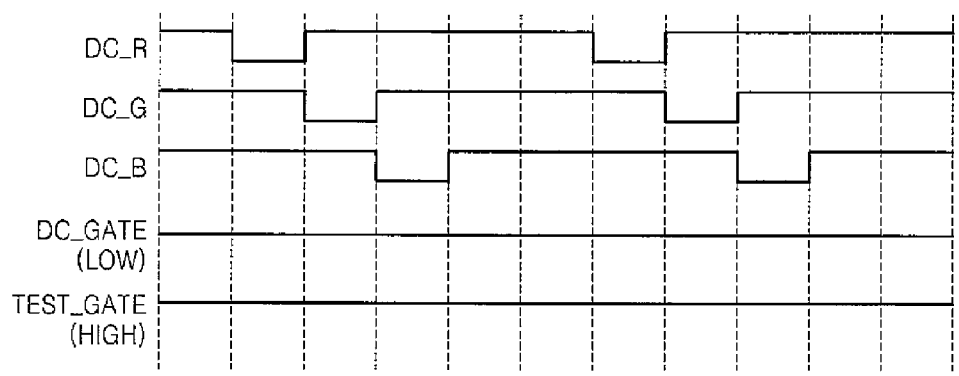
FIG. 7 is a timing diagram for describing a lighting test for the display apparatus of FIG. 5.

FIG. 5 is a diagram of a display apparatus according to another embodiment of the present invention. FIG. 6 is a timing diagram for illustrating a wire test for the display apparatus of FIG. 5, and FIG. 7 is a timing diagram for illustrating a lighting test for the display apparatus of FIG. 5.

Referring to FIG. 5, red pixels R, green pixels G, and blue pixels B are arranged in the display unit 110 in a line in a respective column. For convenience of description, the scan lines SL1 through SLn are not shown in FIG. 5. In FIG. 5, an initialization unit 150B may perform a lighting test, as well as an initialization operation for a wire test. Accordingly, a separate circuit for a lighting test is not used.

The data pads DP1 through DPm coupled to the fan-out lines FOL1 through FOLm respectively extending from one ends of the data lines DL1 through DLm may be in the IC mount region 130.

The initialization unit 150B includes a plurality of first switches SB1 respectively coupled to the other ends of the data lines DL1 through DLm. The first switches SB1 may include first initialization switches SB11, second initialization switches SB12, and third initialization switches SB13. Gates of the first through third initialization switches SB11 through SB13 are coupled to a control line 16a for supplying an initialization control signal DC_GATE. A first terminal of the first initialization switch SB11 is coupled to a first signal line 16b for supplying a first initialization signal DC_R, and a second terminal of the first initialization switch SB11 is coupled to a data line of a column where the red pixels R are arranged. A first terminal of the second initialization switch SB12 is coupled to a second signal line 16c for supplying a second initialization signal DC_G, and a second terminal of the second initialization switch SB12 is coupled to a data line of a column where the green pixels G are arranged. A first terminal of the third initialization switch SB13 is coupled to a third signal line 16d for supplying a third initialization signal DC_B, and a second terminal of the third initialization switch SB13 is coupled to a data line of a column where the blue pixels B are arranged.

A test unit 140B may include second switches SB2 between the data pads DP1 through DPm of the IC mount region 130 and the test signal line 14b. A gate of the second switch SB2 is coupled to the control line 14a for supplying the test control signal TEST_GATE. A first terminal of the second switch SB2 is coupled to the test signal line 14b for supplying the test signal TEST_DATA, and a second terminal of the second switch SB2 is coupled to one of the data pads DP1 through DPm.

Referring to FIG. 6, a wire test may be performed during the first period T1, which is an initialization section and the second period T2, which is a test section.

In the first period T1, the first through third initialization switches SB11 through SB13 receive the initialization control signal DC_GATE for maintaining an on-state, and maintain the on-state. The first through third initialization signals DC_R through and DC_B of the first voltage V1 at the same low level are supplied to the first through third signal lines 16b through 16d, and the first through third initialization switches SB11 through SB13 supply the first through third initialization signals DC_R through DC_B to the data lines DL1 through DLm. In the first period T1, the second switches SB2 receive the test control signal TEST_GATE for maintaining an off-state, and maintain the off-state.

In the second period T2, the first through third initialization switches SB11 through SB13 receive the initialization control signal DC_GATE for maintaining an off-state, and maintain the off-state. In the second period T2, the scan signals S1 through Sn are sequentially supplied from scan lines to the pixels PX, and the second switches SB2 receive the test control signal TEST_GATE for maintaining an on-state. Accordingly, the second switches SB2 maintain the on-state while supplying the test signal TEST_DATA of the second voltage V2 at a high level from the test signal line 14b to the data lines DL1 through DLm.

The voltage Vr lower than the second voltage V2 is supplied to a data line supplied through a fan-out line that is resistance defective from among the fan-out lines FOL1 through FOLm. Accordingly, pixels in a column including a data line coupled to a fan-out line having a resistance defect have a vertical line defect and a luminance difference corresponding to a voltage difference ($\Delta V = V2 - Vr$) compared to pixels in adjacent columns.

In other words, a fan-out line coupled to a data line of a column emitting a light having higher or lower luminance than that of adjacent columns may be detected to have a resistance defect or a short defect. The short defect and resistance defect may be differentiated from each other based on a degree of a luminance difference with respect to adjacent columns.

Referring to FIG. 7, a lighting test separate from a wire test may be performed by the initialization unit 150B.

During the lighting test according to an embodiment, the test unit 140B is inactive. In other words, the second switches SB2 receive the test control signal TEST_GATE for maintaining an off-state, and maintain the off-state.

The first through third initialization switches SB11 through SB13 of the initialization unit 150B receive the initialization control signal DC_GATE for maintaining an on-state, and maintain the on-state. The first through third initialization signals DC_R through DC_B may be supplied as lighting test signals sequentially to the first through third signal lines 16b through 16d. Accordingly, the first through third initialization switches SB11 through SB13 supply the first through third initialization signals DC_R through DC_B to the data lines DL1 through DLm.

Figure 8:
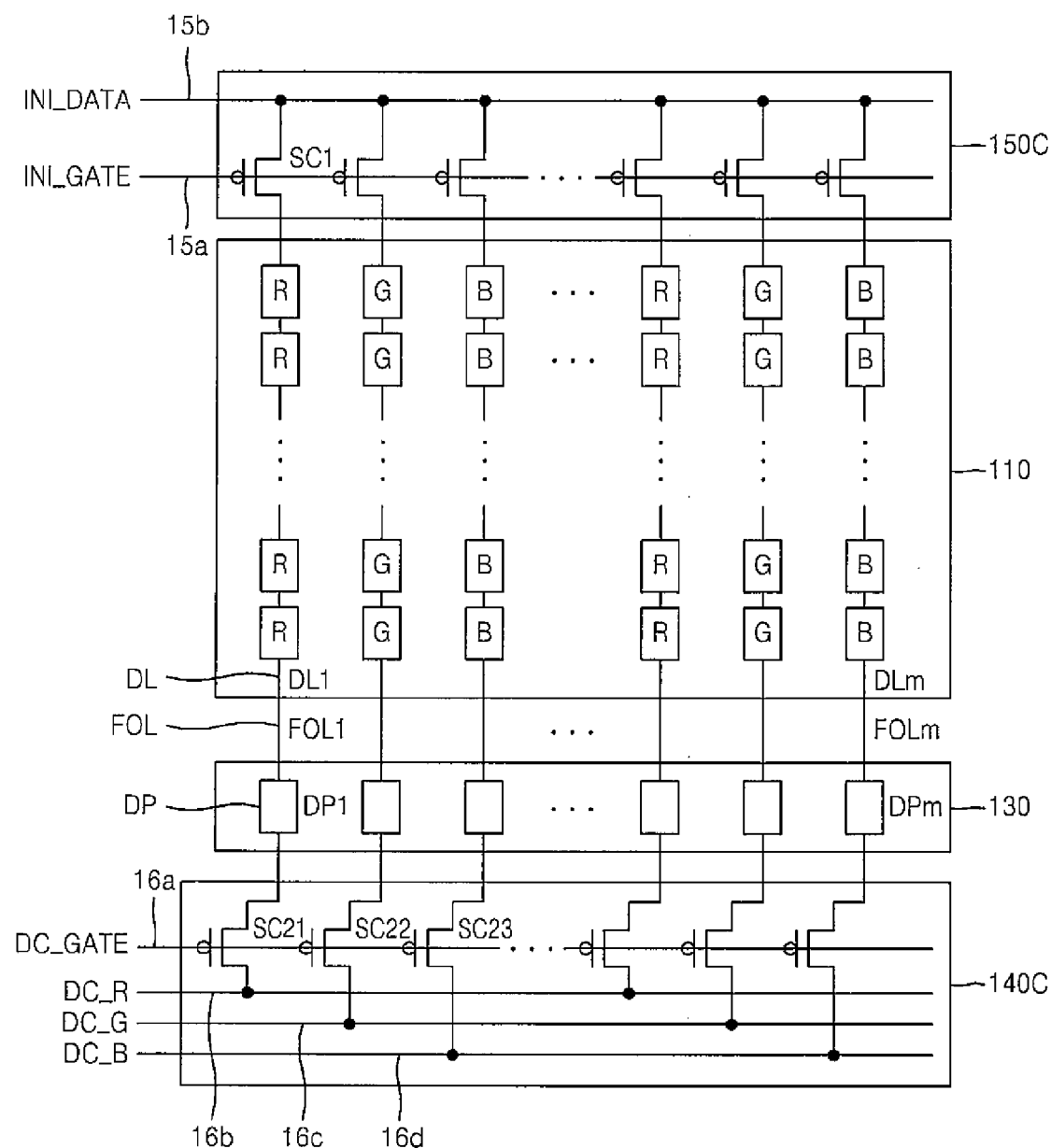
FIG. 8 is a diagram of a display apparatus according to another embodiment of the present invention.
Figure 9:
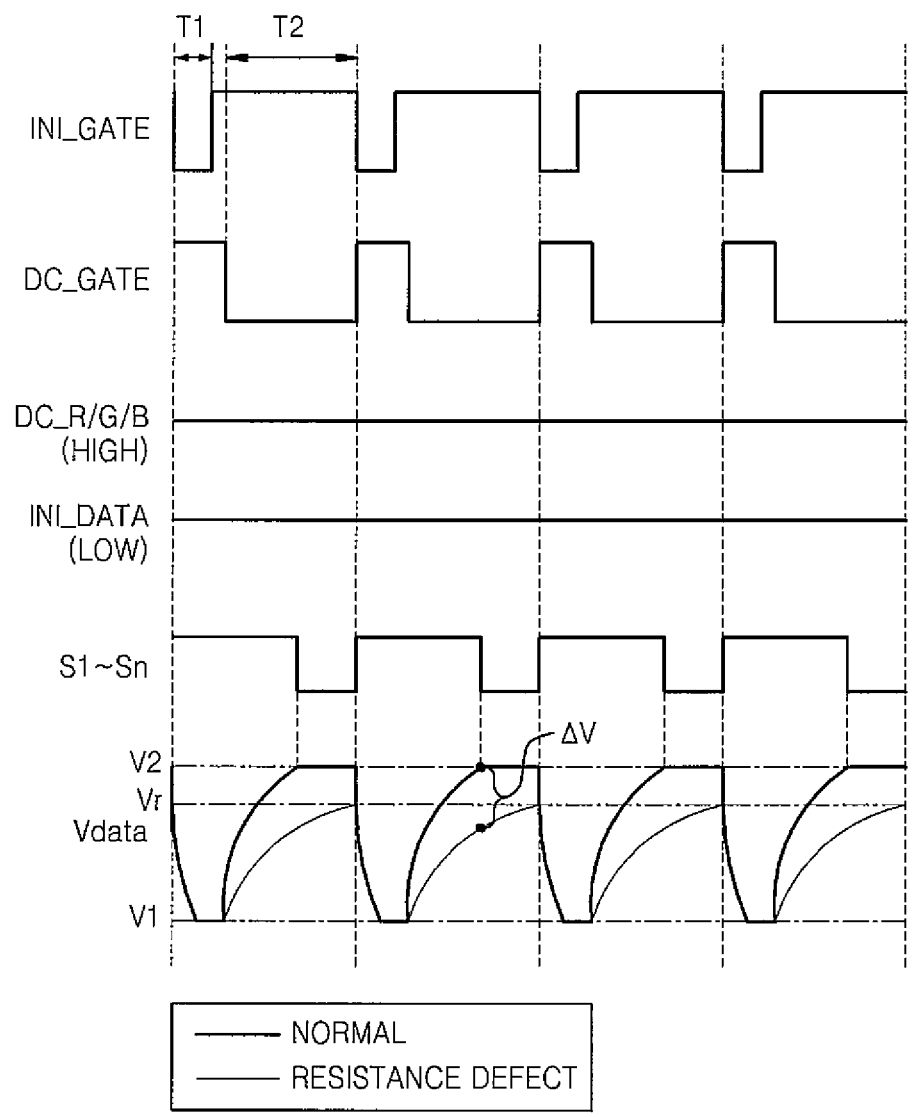
FIG. 9 is a timing diagram for describing a wire test for the display apparatus of FIG. 8.

FIG. 8 is a diagram of a display apparatus according to another embodiment of the present invention. FIG. 9 is a timing diagram for illustrating a wire test for the display apparatus of FIG. 8.

Referring to FIG. 8, the red pixels R, the green pixels G, and the blue pixels B are arranged in a line in each column, in the display unit 110. For convenience of description, the scan lines SL1 through SLn are not shown in FIG. 8. In the current embodiment of FIG. 8, a wire test unit 140C may perform a lighting test as well as a wire test. Accordingly, a separate circuit for a lighting test is not required.

The data pads DP1 through DPm coupled to the fan-out lines FOL1 through FOLm respectively extending from ends of the data lines DL1 through DLm may be in the IC mount region 130.

An initialization unit 150C includes a plurality of first switches SC1 respectively coupled to other ends of the data lines DL1 through DLm. A gate of the first switch SC1 is coupled to the control line 15a for supplying the initialization control signal INI_GATE. A first terminal of the first switch SC1 is coupled to the initialization signal line 15b for supplying the initialization signal INI_DATA, and a second terminal of the first switch SC1 is coupled to one of the data lines DL1 through DLm.

The wire test unit 140C may include second switches SC2 located between the data pads DP1 through DPm of the IC mount region 130 and the first through third test signal lines 16b through 16d. The second switches SC2 may include first test switches SC21, second test switches SC22, and third test switches SC23. Gates of the first through third test switches SC21 through SC23 are coupled to the control line 16a for supplying a test control signal DC_GATE. A first terminal of the first test switch SC21 is coupled to the first signal line 16b for supplying a first test signal DC_R, and a second terminal of the first test switch SC21 is coupled to one of the data pads DP1 through DPm. A first terminal of the second test switch SC22 is coupled to the second signal line 16c for supplying a second test signal DC_G, and a second terminal of the second test switch SC22 is coupled to one of the data pads DP1 through DPm. A first terminal of the third test switch SC23 is coupled to the third signal line 16d for supplying a third test signal DC_B, and a second terminal of the third test switch SC23 is coupled to one of the data pads DP1 through DPm.

Referring to FIG. 9, the wire test may be performed during the first period T1, which is an initialization section and during the second period T2, which is a test section.

The first switches SC1 receive, during the first period T1, the initialization control signal INI_GATE for maintaining an on-state. Accordingly, the first switches SC1 maintain the on-state while supplying the initialization signal INI_DATA of the first voltage V1 at a low level from the initialization signal line 15b to the data lines DL1 through DLm. In the first period T1, the second switches SC2 receive the test control signal DC_GATE for maintaining an off-state, and maintain the off-state.

In the second period T2, the first switches SC1 receive the initialization control signal INI_GATE for maintaining an off-state, and maintain the off-state. In the second period T2, the scan signals S1 through Sn are sequentially supplied from scan lines to the red, green, and blue pixels R, G, and B, and the first through third test switches SC21 through SC23 receive the test control signal DC_GATE for maintaining an on-state and maintain the on-state. The first through third test signals DC_R through DC_B of the first voltage V1 at the same high level are supplied to the first through third test signal lines 16b through 16d. The first through third test switches SC21 through SC23 supply the first through third test signals DC_R through DC_B to the data lines DL1 through DLm.

The voltage Vr lower than the second voltage V2 is supplied to a data line supplied through a fan-out line that is resistance defective from among the fan-out lines FOL1 through FOLm. Accordingly, pixels in a column including a data line coupled to a fan-out line having a resistance defect have a vertical line defect and a luminance difference corresponding to a voltage difference ($\Delta V = V2 - Vr$) compared to pixels in adjacent columns.

In other words, a fan-out line coupled to a data line of a column emitting a light having higher or lower luminance than adjacent columns may be detected to have a resistance defect or a short defect. The short defect and the resistance defect may be differentiated from each other based on a degree of a luminance difference with respect to adjacent columns.

According to an embodiment, the lighting test may be performed by the wire test unit 140C. During the lighting test, the initialization unit 150C is inactive. In other words, the first switches SC1 receive the initialization control signal INI_GATE for maintaining an off-state, and maintain the off-state.

As shown in FIG. 8, the first through third test switches SC21 through SC23 of the wire test unit 140C receive the test control signal DC_GATE for maintaining an on-state, and maintain the on-state. The first through third test signals DC_R through DC_B may be respectively supplied to the first through third signal lines 16b through. 16d as lighting test signals. Accordingly, the first through third test switches SC21 through SC23 respectively supply the first through third test signals DC_R through DC_B to the data lines DL1 through DLm.

Figure 10:
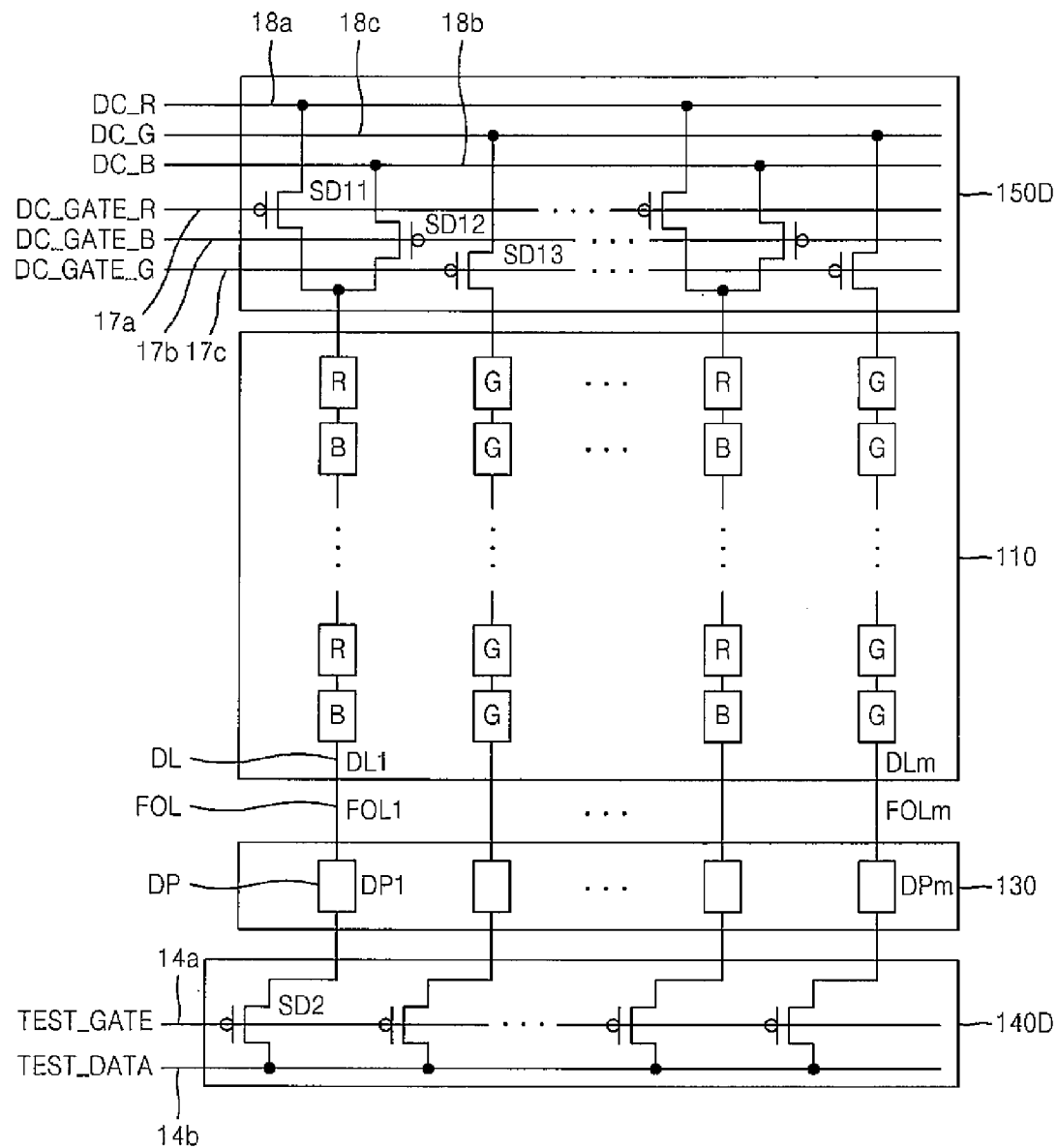
FIG. 10 is a diagram of a display apparatus according to another embodiment of the present invention.
Figure 11:
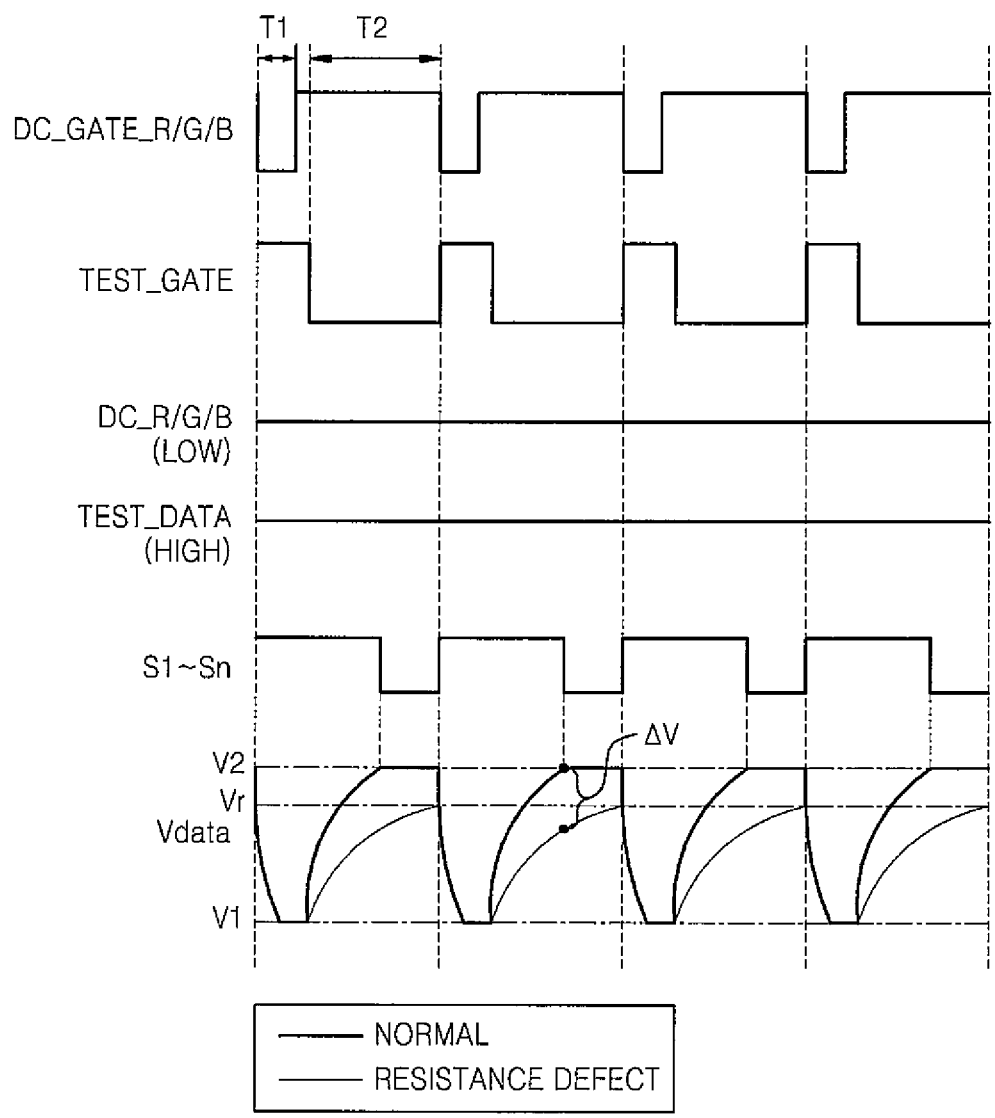
FIG. 11 is a timing diagram for describing a wire test for the display apparatus of FIG. 10.
Figure 12:
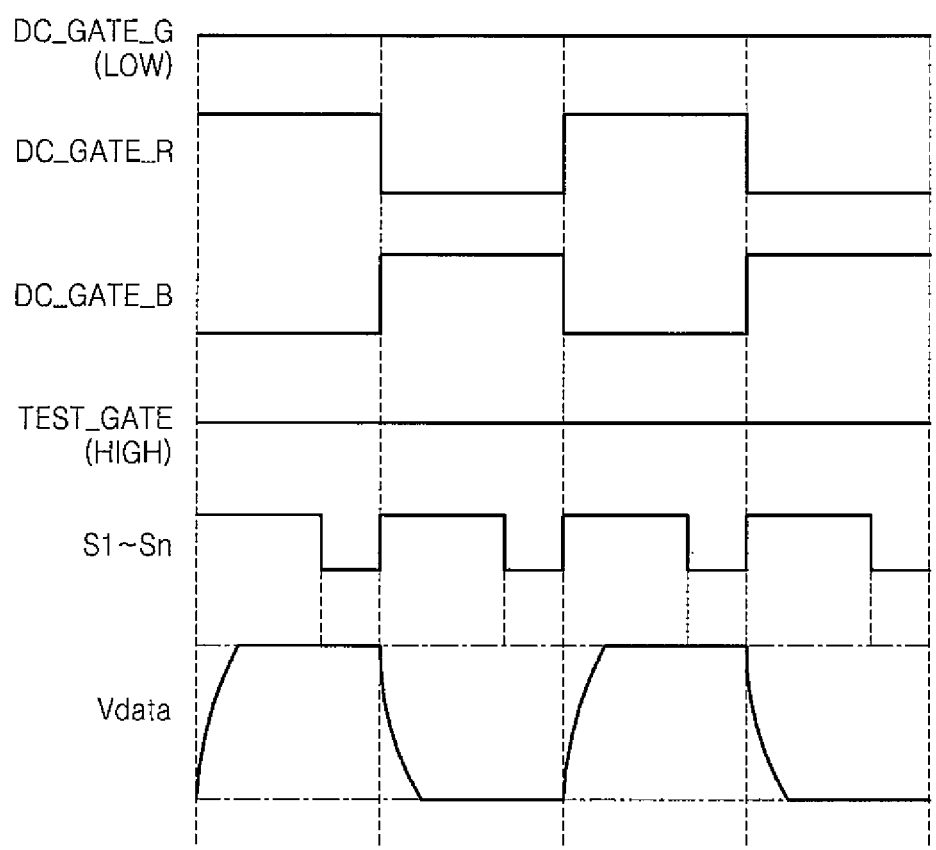
FIG. 12 is a timing diagram for describing a lighting test for the display apparatus of FIG. 10.

FIG. 10 is a diagram of a display apparatus according to another embodiment of the present invention. FIG. 11 is a timing diagram for illustrating a wire test for the display apparatus of FIG. 10, and FIG. 12 is a timing diagram for illustrating a lighting test for the display apparatus of FIG. 10.

Referring to FIG. 10, the display unit 110 includes first pixels, second pixels, and third pixels, which emit light of different colors, wherein the first and second pixels are alternately arranged in the same column, and the third pixels are arranged in a line in a column adjacent to the column where the first and second pixels are arranged. The first pixels may be the red pixels R emitting a red light, the second pixels may be the blue pixels B emitting a blue light, and the third pixels may be the green pixels G emitting a green light. The red pixels R and the blue pixels B are alternately arranged in the same column, and the green pixels G are arranged in a line in a column adjacent to the column where the red and blue pixels R and B are arranged. For convenience of description, the scan lines SL1 through SLn are not shown in FIG. 10.

In the embodiment of FIG. 10, an initialization unit 150D may perform a lighting test as well as an initialization operation of a wire test. Accordingly, a separate circuit for a lighting test may not be used.

The data pads DP1 through DPm coupled to the fan-out lines FOL1 through FOLm respectively extending from ends of the data lines DL1 through DLm may be in the IC mount region 130.

The initialization unit 150D includes a plurality of first switches SD1 respectively coupled to the other ends of the data lines DL1 through DLm. The first switches SD1 may include first initialization switches SD11, second initialization switches SD12, and third initialization switches SD13. The first and second initialization switches SD11 and SD12 are coupled to the column where the red and blue pixels R and B are alternately arranged. The third initialization switch SD13 is coupled to the column where the green pixels G are arranged.

A gate of the first initialization switch SD11 is coupled to a control line 17a for supplying a first initialization control signal DC_GATE_R, a first terminal is coupled to a first signal line 18a for supplying a first initialization signal DC_R, and a second terminal is coupled to a data line of the column where the red and blue pixels R and B are alternately arranged. A gate of the second initialization switch SD12 is coupled to a control line 17b for supplying a second initialization control signal DC_GATE_B, a first terminal is coupled to a second signal line 18b for supplying a second initialization signal DC_B, and a second terminal is coupled to the data line of the column where the red and blue pixels R and B are alternately arranged. A gate of the third initialization switch SD13 is coupled to a control line 17c for supplying a third initialization control signal DC_GATE_G, a first terminal is coupled to a third signal line 18c for supplying a third initialization signal DC_G, and a second terminal is coupled to a data line of the column where the green pixels G are arranged.

The test unit 140B may include second switches SD2 between the data pads DP1 through DPm of the IC mount region 130, and the test signal line 14b. A gate of the second switch SD2 is coupled to the control line 14a for supplying the test control signal TEST_GATE. A first terminal of the second switch SB2 is coupled to the test signal line 14b for supplying the test signal TEST_DATA, and a second terminal is coupled to one of the data pads DP1 through DPm.

Referring to FIG. 11, a wire test may be performed during the first period T1 that is an initialization section and during the second period T2 that is a test section.

In the first period T1, the first through third initialization switches SD11 through SD13 receive the first through third initialization control signals DC_GATE_R through DC_GATE_G for maintaining an on-state, and maintain the on-state. Here, the first, through third initialization signals DC_R, DC_B, and DC_G of the first voltage V1 at the same low level are respectively supplied to the first through third signal lines 18b through 18d, and the first through third initialization switches SD11 through SD13 respectively supply the first, second, and third initialization signals DC_R, DC_B, and DC_G to the data lines DL1 through DLm. In the first period T1, the second switches SD2 receive the test control signal TEST_GATE for maintaining an off-state, and maintain the off-state.

In the second period T2, the first through third initialization switches SD11 through SD13 receive the first through third initialization control signals DC_GATE_R through DC_GATE_B for maintaining an off-state, and maintain the off-state. In the second period T2, the scan signals S1 through Sn are sequentially supplied from a scan line to the red, green, and blue pixels R, G, and B, and the second switches SD2 receive the test control signal TEST_GATE for maintaining an on-state. Accordingly, the second switches SD2 maintain the on-state while supplying the test signal TEST_DATA of the second voltage V2 in a high level from the test signal line 14b to the data lines DL1 through DLm.

The voltage Vr lower than the second voltage V2 is supplied to a data line supplied through a fan-out line that is resistance defective from among the fan-out lines FOL1 through FOLm. Accordingly, pixels in a column including a data line coupled to a fan-out line having a resistance defect have a vertical line defect and a luminance difference corresponding to a voltage difference ($\Delta V = V2 - Vr$) compared to pixels in adjacent columns.

In other words, a fan-out line coupled to a data line of a column emitting a light having higher or lower luminance than that of adjacent columns may be detected to have a resistance defect or a short defect. The short defect and the resistance defect may be differentiated from each other based on a degree of a luminance difference with respect to adjacent columns.

Referring to FIG. 12, a lighting test may be performed by the initialization unit 150D.

During the lighting test, a wire test unit 140D is inactive. In other words, the second switches SD2 receive the test control signal TEST_GATE for maintaining an off-state, and maintain the off-state.

The first through third initialization switches SD11 through SD13 of the initialization unit 150D receive the first through third initialization control signals DC_GATE_R through DC_GATE_G for maintaining an on-state, and maintain the on-state. The first and second initialization control signals DC_GATE_R and DC_GATE_B are alternately supplied.

Here, the first through third initialization signals DC_R, DC_B, and DC_G may be respectively supplied to the first through third signal lines 18a through 18c, as lighting test signals. Accordingly, the first through third initialization switches SD11 through SD13 respectively supply the first, second, and third initialization signals DC_R, DC_B, and DC_G to the data lines DL1 through DLm.

Figure 13:
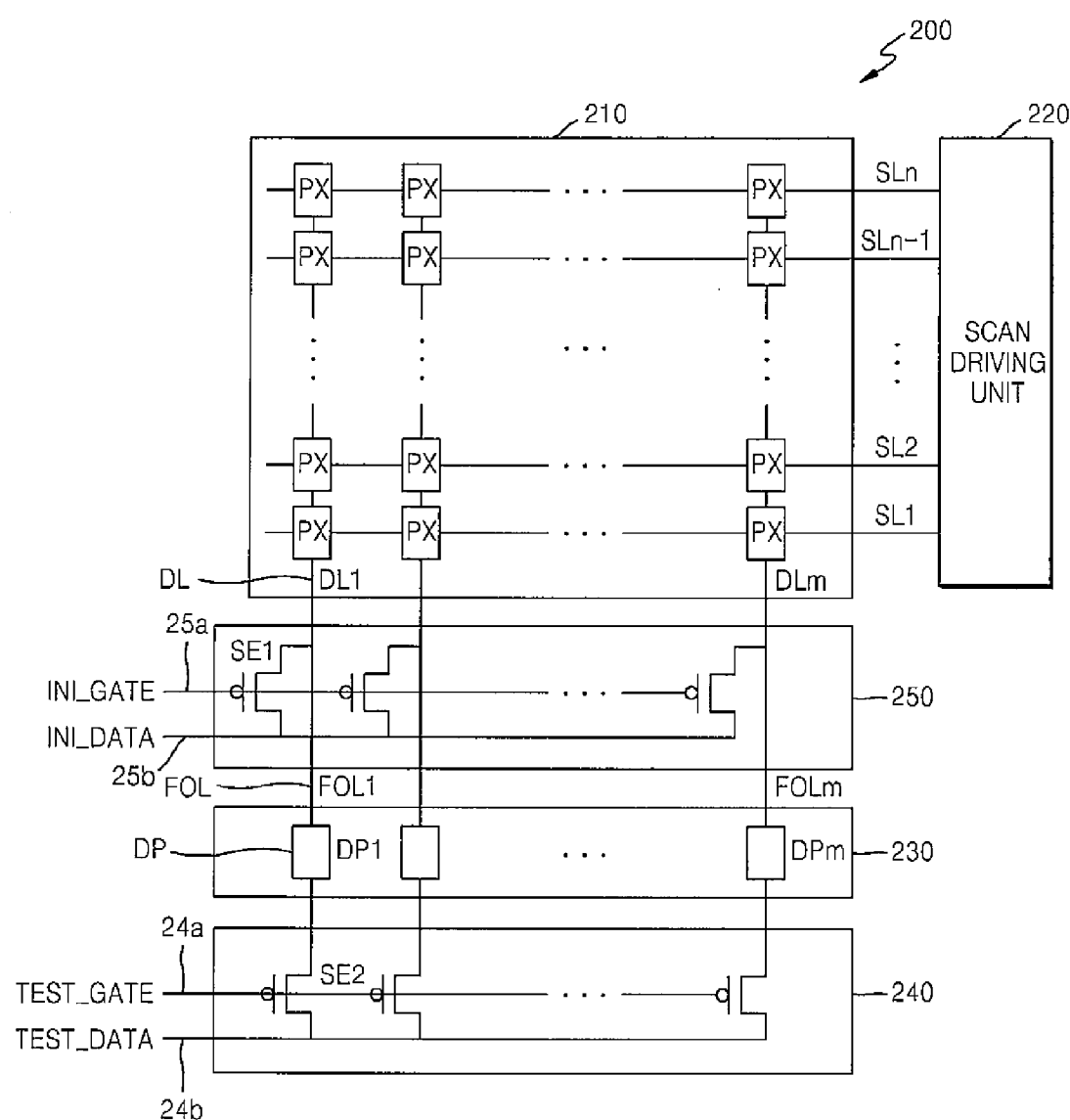
FIG. 13 is a plan view schematically illustrating a display apparatus according to another embodiment of the present invention.

FIG. 13 is a plan view schematically illustrating a display apparatus 200 according to another embodiment of the present invention.

The display apparatus 200 of FIG. 13 is different from the display apparatus 100 of FIG. 3 in that an initialization unit 250 is disposed between the data pads DP1 through DPm and the data lines DL1 through DLm. Details about the same features will not be repeated.

Referring to FIG. 13, the display apparatus 200 includes a display unit 210, a scan driving unit 220 (or scan driver), an IC mount region 230, a wire test unit 240, and the initialization unit 250. Each component may receive power and/or signals from pads.

The initialization unit 250 is adjacent the data lines DL1 through DLm of the display unit 210. The initialization unit 250 includes a plurality of first switches SE1 respectively coupled to one end of the data lines DL1 through DLm. A gate of the first switch SE1 is coupled to a control line 25a for supplying the initialization control signal INI_GATE. A first terminal of the first switch SE1 is coupled to an initialization signal line 25b for supplying the initialization signal INI_DATA, and a second terminal is coupled to one of the data lines DL1 through DLm.

The wire test unit 240 may include second switches SE2 between the data pads DP1 through DPm of the IC mount region 130 and a test signal line 24b. A gate of the second switch SE2 is coupled to a control line 24a for supplying the test control signal TEST_GATE. A first terminal of the second switch SE2 is coupled to the test signal line 24b for supplying the test signal TEST_DATA, and a second terminal is coupled to one of the data pads DP1 through DPm.

For a wire test, the initialization signal INI_DATA may be supplied to the data lines DL1 through DLm through the first switches SE1 of the initialization unit 250 during an initialization section, and the test signal TEST_DATA may be supplied to the data lines DL1 through DLm via the fan-out lines FOL1 through FOLm through the second switches SE2 of the wire test unit 240 during a test section.

In one or more embodiments, not only a short defect of a fan-out line but also a resistance defect may be accurately detected by first applying an initialization signal to data lines without passing through the fan-out lines, and then applying a test signal to the data lines via the fan-out lines.

In one or more embodiments, because an initialization unit or a wire test unit performs a lighting test as well as a wire test, a separate circuit for a lighting test is not used, and thus, a non-display region may be reduced.

In one or more embodiments, a display unit includes a red pixel, a blue pixel, and a green pixel, by ways of example, but the display unit may further include a pixel for displaying a color other than red, green, and blue.

In one or more embodiments, switches are all of a p-channel metal-oxide-semiconductor field-effect transistor (PMOS) type. Alternatively, the switches may be of an NMOS type or different conductive types, and signal levels for turning on or off the switches may differ correspondingly.

As described above, according to the one or more of the above embodiments of the present invention, a resistance defect, which is caused by a break of a fan-out line attached to a module, and an open circuit may be concurrently (e.g., simultaneously) detected.

While one or more embodiments of the present invention have been described with reference to the appended figures, it will be understood by those of ordinary skill in the art that various changes in form and details may be made therein without departing from the spirit and scope of the present invention as defined by the following claims and their equivalents.

What is claimed is:

1. A display apparatus comprising:
    a display unit including a plurality of pixels connected to a plurality of scan lines and a plurality of data lines;
    an initialization unit configured to apply an initialization signal to the plurality of data lines to initialize the data lines to a first voltage level when scan signals are not supplied to the pixels via the scan lines; and
    a wire test unit configured to apply a wire test signal to the plurality of data lines through a plurality of fan-out lines respectively connected at a first end of each of the plurality of data lines to detect a defect in one of the data lines or the fan-out lines after the data lines have been initialized by the initialization signal.

2. The display apparatus of claim 1, wherein the initialization signal is configured to be applied before the wire test signal.

3. The display apparatus of claim 1, wherein the initialization unit comprises a plurality of first switches respectively located between initialization signal lines and a second end of each of the plurality of data lines.

4. The display apparatus of claim 3, wherein the plurality of first switches comprises:
    a first initialization switch between a first initialization signal line of the initialization signal lines and a data line corresponding to a column of first pixels;
    a second initialization switch between a second initialization signal line of the initialization signal lines and a data line corresponding to a column of second pixels; and
    a third initialization switch between a third initialization signal line of the initialization signal lines and a data line corresponding to a column of third pixels.

5. The display apparatus of claim 4, wherein
    the first pixels and the second pixels are alternately arranged in a same column,
    the first initialization switch is between the first initialization signal line and the data line of the column of the first pixels and the second pixels, and
    the second initialization switch is between the second initialization signal line and the data line of the column of the first pixels and the second pixels.

6. The display apparatus of claim 3, wherein the initialization unit is configured to apply a lighting test signal supplied from the initialization signal lines to the plurality of data lines through the plurality of first switches at a time different from a time when the initialization signal is applied.

7. The display apparatus of claim 1, wherein the wire test unit comprises a plurality of second switches respectively located between each of the plurality of fan-out lines and a test signal line, wherein the test signal line is configured to provide the wire test signal.

8. The display apparatus of claim 7, wherein the plurality of second switches comprises:
    a first test switch between a first test signal line and a first fan-out line of the plurality of fan-out lines connected to a data line corresponding to a column of first pixels;
    a second test switch between a second test signal line and a second fan-out line of the plurality of fan-out lines connected to a data line corresponding to a column of second pixels; and
    a third test switch between a third test signal line and a third fan-out line of the plurality of fan-out lines connected to a data line corresponding to a column of third pixels.

9. The display apparatus of claim 7, further comprising a plurality of data pads connected to the plurality of fan-out lines,
    wherein the plurality of second switches are respectively located between the plurality of data pads and the test signal line.

10. The display apparatus of claim 9, wherein the plurality of second switches comprises:
    a first test switch between a first test signal line and a data pad connected to a first fan-out line of the plurality of fan-out lines, wherein the first fan-out line is connected to a data line corresponding to a column of first pixels;

a second test switch between a second test signal line and a data pad connected to a second fan-out line of the plurality of fan-out lines, wherein the second fan-out line is connected to a data line corresponding to a column of second pixels; and a third test switch between a third test signal line and a data pad connected to a third fan-out line of the plurality of fan-out lines, wherein the third fan-out line is connected to a data line corresponding to a column of third pixels.

11. The display apparatus of claim 7, wherein the wire test unit is configured to apply a lighting test signal supplied from the test signal line to the plurality of data lines through the plurality of second switches at a time different from a time the wire test signal is applied.

12. A display apparatus comprising:
a display unit including a plurality of pixels connected to a plurality of scan lines and a plurality of data lines;
an initialization unit comprising a plurality of first switches between a first signal line and a first end of each of the plurality of data lines, the plurality of first switches being configured to apply an initialization signal supplied by the first signal line to the first end of each of the plurality of data lines through the plurality of first switches to initialize the data lines to a first voltage level when scan signals are not supplied to the pixels via the scan lines; and
a wire test unit comprising a plurality of second switches between a second signal line and a plurality of fan-out lines, the plurality of fan-out lines being connected to a second end of each of the plurality of data lines, the plurality of second switches being configured to apply a wire test signal supplied by the second signal line to the second end of each of the plurality of data lines via the plurality of fan-out lines through the plurality of second switches to detect a defect in one of the data lines or the fan-out lines after the data lines have been initialized by the initialization signal.

13. The display apparatus of claim 12, wherein the initialization signal is configured to be applied before the wire test signal.

14. The display apparatus of claim 12, wherein each of the plurality of first switches comprises:
a gate connected to a control line;
a first terminal connected to the first signal line; and
a second terminal connected to the first end of one of the plurality of data lines.

15. The display apparatus of claim 12, wherein the initialization unit comprises a plurality of first signal lines, and
each of the plurality of first switches comprises a gate connected to a control line, a first terminal connected to one of the plurality of first signal lines, and a second terminal connected to the first end of one of the plurality of data lines.

16. The display apparatus of claim 12, wherein the initialization unit comprises a plurality of first signal lines, and
each of the plurality of first switches comprises a gate connected to one of a plurality of control lines, a first terminal connected to one of the plurality of first signal lines, and a second terminal connected to the first end of one of the plurality of data lines.

17. The display apparatus of claim 12, wherein the plurality of first switches are configured to apply a lighting test signal to the first end of each of the plurality of data lines at a time different from a time when the initialization signal is applied.

18. The display apparatus of claim 12, wherein each of the plurality of second switches comprises a gate connected to a control line, a first terminal connected to the second signal line, and a second terminal connected to one of the plurality of fan-out lines.

19. The display apparatus of claim 12, wherein the initialization unit comprises a plurality of second signal lines, and
each of the plurality of first switches comprises a gate connected to a control line, a first terminal connected to one of the plurality of second signal lines, and a second terminal connected to one of the plurality of fan-out lines.

20. The display apparatus of claim 12, wherein the plurality of second switches are configured to apply a lighting test signal to the second end of each of the plurality of data lines at a time different from a time when the wire test signal is applied.

21. The display apparatus of claim 12, further comprising a plurality of data pads respectively connected to the plurality of fan-out lines, and
the plurality of second switches being located between the plurality of data pads and the second signal line.

22. A method of testing a display apparatus comprising a display unit including a plurality of pixels connected to a plurality of scan lines and a plurality of data lines and a plurality of fan-out lines respectively connected to a first end of each of the plurality of data lines, the method comprising:
applying, by an initialization unit, an initialization signal to the first end or a second end of each of the plurality of data lines to initialize the data lines to a first voltage level when scan signals are not supplied to the pixels via the scan lines; and
applying, by a wire test unit, a wire test signal to the second end of each of the plurality of data lines via the plurality of fan-out lines to detect a defect in one of the data lines or the fan-out lines after the data lines have been initialized by the initialization signal.

23. The method of claim 22, wherein the wire test signal is applied after the initialization signal is applied to the plurality of data lines.

24. The method of claim 22, wherein the applying of the initialization signal comprises:
electrically connecting, by a plurality of first switches respectively located between the first end or the second end of each of the plurality of data lines and a signal line, the signal line being configured to supply the initialization signal; and
applying the initialization signal to the first end or the second end of each of the plurality of data lines through the plurality of first switches.

25. The method of claim 22, wherein the applying of the wire test signal comprises:
electrically connecting, by a plurality of second switches respectively located between the plurality of fan-out lines and a test signal line, the test signal line being configured to supply the wire test signal; and
applying the wire test signal to the second end of each of the plurality of data lines through the plurality of second switches.

26. The method of claim 22, further comprising detecting a defective fan-out line connected to a data line of the plurality of data lines corresponding to a column of pixels emitting light having a luminance higher than a luminance of adjacent columns from among the plurality of pixels.

27. The method of claim 22, further comprising applying a lighting test signal to the second end of each of the plurality of data lines.

\* \* \* \* \*